(12) United States Patent
Kim

(10) Patent No.: US 6,376,874 B1
(45) Date of Patent: Apr. 23, 2002

(54) METHOD FOR FABRICATING A CAPACITOR OF A SEMICONDUCTOR MEMORY DEVICE

(75) Inventor: Hyeon-Soo Kim, Sungnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/584,718

(22) Filed: Jun. 1, 2000

Related U.S. Application Data

(62) Division of application No. 09/339,379, filed on Jun. 24, 1999.

(30) Foreign Application Priority Data

Jun. 24, 1998 (KR) .............................................. 98-23855

(51) Int. Cl.$^7$ ............................................ H01L 27/108
(52) U.S. Cl. ........................ 257/306; 257/303; 438/398
(58) Field of Search ................................. 438/398, 396, 438/397, 388, 389; 257/306, 296, 303, 308, 309

(56) References Cited

U.S. PATENT DOCUMENTS

| | | | |
|---|---|---|---|
| 5,278,091 A | * | 1/1994 | Fazan et al. .................. 437/52 |
| 5,597,756 A | | 1/1997 | Fazan et al. .................. 437/52 |
| 5,753,558 A | | 5/1998 | Akram et al. ................ 438/386 |
| 6,046,093 A | * | 4/2000 | DeBoer et al. ............. 438/398 |
| 6,153,899 A | * | 11/2000 | Ping ........................... 257/296 |
| 6,177,309 B1 | * | 1/2001 | Lee ............................. 438/253 |

* cited by examiner

Primary Examiner—Olik Chaudhuri
Assistant Examiner—Ginette Peralta
(74) Attorney, Agent, or Firm—The Law Offices of Eugene M. Lee, P.L.L.C.

(57) ABSTRACT

An improved capacitor for a semiconductor memory device for preventing a bridge between storage electrodes and enlarging a surface area of a capacitor can be manufactured by forming a second insulating layer on a first insulating layer including a plug, etching the second insulating layer to form a storage electrode opening by using a storage electrode formation mask until the plug and a part of the first insulating layer are exposed, forming a conductive spacer on the sidewalls of the storage electrode opening to connect electrically to the plug, and forming an HSG (hemispherical grain) layer on the surfaces of the conductive spacers and the plug. A capacitor according to the present invention enables the HSG layer to grow on an internal wall of a storage electrode, thereby preventing a micro-bridge between storage electrodes resulting from abnormal growth or overgrowth of the HSG layer.

7 Claims, 4 Drawing Sheets

METHOD FOR FABRICATING A CAPACITOR OF A SEMICONDUCTOR MEMORY DEVICE

This application is a divisional of application Ser. No. 09/339,379, filed Jun. 24, 1999.

BACKGROUND OF THE INVENTION

1. Field of the Invention

The present invention relates to a method for fabricating a semiconductor memory device and, more particularly, to a method for fabricating a capacitor of a semiconductor memory device.

2. Description of the Related Art

A high capacitance capacitor is more advantageous for the purpose of securing reliability of a semiconductor device. Especially for memory devices among the semiconductor elements, a capacitor is required whose capacitance is as high as possible so as to preserve refresh due to automatic extinction of a data value. Accordingly, every effort has been made to increase capacitance in the memory products.

Capacitance may be increased by enlarging a surface area of a storage electrode or by using a dielectric film whose dielectric constant is great. However, most dielectric films are still developing except for an NO film and an ONO film. Accordingly, capacitance is generally increased by enlarging a surface area of the storage electrode.

A surface area of a storage electrode may be enlarged with a stack type, a cylinder type, a fin type, or a trench type. The trench type and the stack type are mainly used. For the trench type, a capacitor is made by depositing a storage electrode layer after digging a trench on a semiconductor substrate. The trench type may enlarge the surface area of a capacitor, but have a complex and difficult isolation or processing procedure.

On the contrary, the stack type has a simple processing procedure. Furthermore, it is not complex to increase the height of the stack for the purpose of increasing capacitance. However, this increased height makes lithography difficult during a subsequent metal wiring process. That is, a step between a cell and a peripheral region becomes so great that a focus margin of lithography is reduced, thereby making the metal wiring thin or generating a cut-off or bridge. In view of solving the foregoing matters, it is required that a storage electrode have a small step between a cell and a peripheral region. Since a dielectric film having a very high dielectric constant is not generally available yet, an HSG (hemispherical grain) method is generally used to enlarge a surface area of a capacitor.

FIG. 1A to FIG. 1C illustrate sequential processes of a method for fabricating a capacitor of a prior semiconductor memory device.

Referring to FIG. 1A, a device isolation layer 11 for defining an active region and an inactive region is formed on a semiconductor substrate 10. A gate electrode layer 103 is formed on a gate oxide layer over the semiconductor substrate 10. An oxide layer 14, which is formed from a lower oxide layer 14a and an upper oxide layer 14b and serves as an insulating layer, is formed on the semiconductor substrate 10, including the gate electrode layer 13, where a transistor is formed.

A bit line 15 is formed in the oxide layer 14, between the lower oxide layer 14a and the upper oxide layer 14b. The oxide layer 14 is etched to form a contact hole 16 by using a contact hole formation mask until a surface of the semiconductor substrate 10 is exposed. The contact hole 16 is filled with a conductive material such as a polysilicon, thereby forming a plug 17 which is electrically connected to the semiconductor substrate 10.

Referring to FIG. 1B, a polysilicon layer 18 serving as a conductive layer is formed on the oxide layer 14 including the plug 17. The polysilicon layer 18 is etched by using the storage electrode formation mask, thereby forming a storage electrode 18 which is electrically connected to the plug 17. An HSG layer 19 enlarging a surface area of a capacitor is formed on a surface of the storage electrode 18.

Referring to FIG. 1C, a capacitor dielectric film 20 is formed on the oxide layer 14 including the HSG layer 19. A polysilicon layer 21, which is doped to serve as an upper capacitor electrode, is deposited on the capacitor dielectric film 20 to form a capacitor.

As mentioned above, a stack type capacitor has merits in that the processing procedure is simple and a throughput is good. However, it is difficult for the stack type capacitor to have enough capacitance value by scaling-down the device design rule according to the high density of a device and form a pattern whose size may prevent a bridge with an adjacent capacitor during formation of an HSG layer.

The reason is as follows. A space between patterned storage electrodes should be wide enough so as to grow an HSG layer. Accordingly, a delicate lithography process is needed and the height of an electrode should be increased so as to atone for a surface area, which may greatly influence the subsequent metal wiring process. As the HSG layer is grown on a surface of a patterned storage electrode, as shown in symbol 'A' of FIG. IB, a part of the HSG layer is connected between the storage electrodes, thereby generating a minute micro-bridge. Since the micro-bridge results in device failure, reliability may be degraded.

SUMMARY OF THE INVENTION

The present invention was made in view of the above problem. A feature of a method and a device consistent with the present invention preferably produces a capacitor of a semiconductor memory device which can prevent a micro-bridge by securing a sufficient margin between storage electrodes and enlarge a surface area of a storage electrode.

In accordance with the present invention, the method includes the steps of forming a first insulating layer on a semiconductor substrate, etching the first insulating layer to form a contact hole, filling the contact hole with a conductive material to form a plug electrically connected to the semiconductor substrate, forming a second insulating layer on the first insulating layer including the plug, etching the second insulating layer until the plug and a part of the first insulating layer are exposed to form a storage electrode opening, forming a conductive spacer on both sidewalls of the storage electrode opening, each conductive spacer being electrically connected to the plug, and forming an HSG (hemispherical grain) on the surfaces of the conductive spacers and the plug.

In a preferred embodiment of the present invention, the method further comprises a step of forming an etch stopper layer on the first insulating layer after formation of the first insulating layer.

According to the preferred embodiment, a second insulating layer is formed on a first insulating layer including a plug. The second insulating layer is etched until the plug and a part of the first insulating layer are exposed, thereby forming a storage electrode opening. A conductive spacer is formed on both sidewalls of the storage electrode opening, wherein each conductive spacer is electrically connected to the plug. An HSG layer is formed on the surfaces of the conductive spacer and the plug.

A capacitor recording to the present invention enables the HSG layer to grow on an internal wall of a storage electrode, thereby preventing a micro-bridge bet storage electrodes resulting from abnormal growth or over-growth of the HSG layer.

BRIEF DESCRIPTION OF THE DRAWINGS

The above features and advantages of the present invention will become more apparent by describing in detail a preferred embodiment thereof with reference to the attached drawings.

DETAILED DESCRIPTION OF THE PREFERRED EMBODIMENTS

Korean application no. 98-23855, filed Jun. 24, 1998, is hereby incorporated by reference as if fully set forth herein.

The present invention will be described in detail, referring to the attached drawings. FIG. 2A to FIG. 2D sequentially illustrate the process steps of a novel method of fabricating a capacitor for a semiconductor memory device.

Figure 1A:
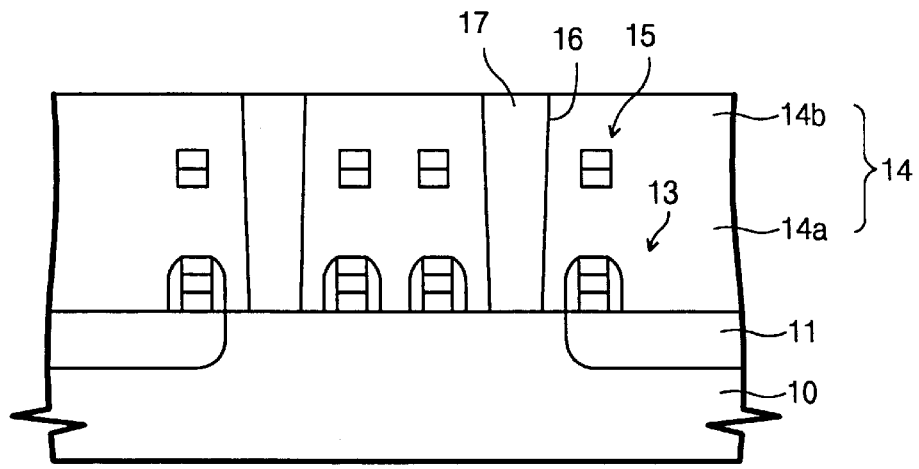
FIG. 1A to FIG. 1C are flow diagrams showing the process steps of a prior art method of fabricating a capacitor for a semiconductor memory device.
Figure 1B:
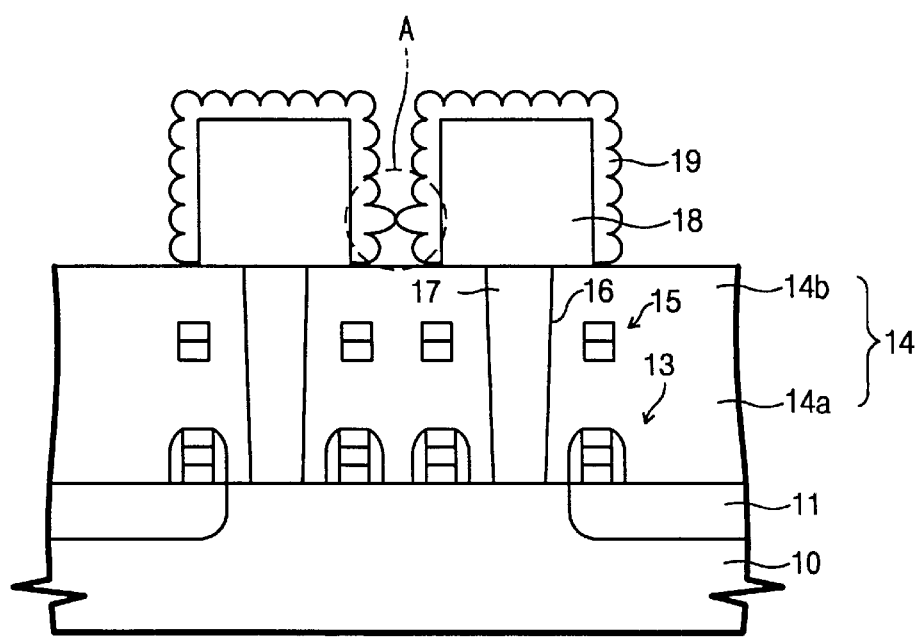
Figure 1C:
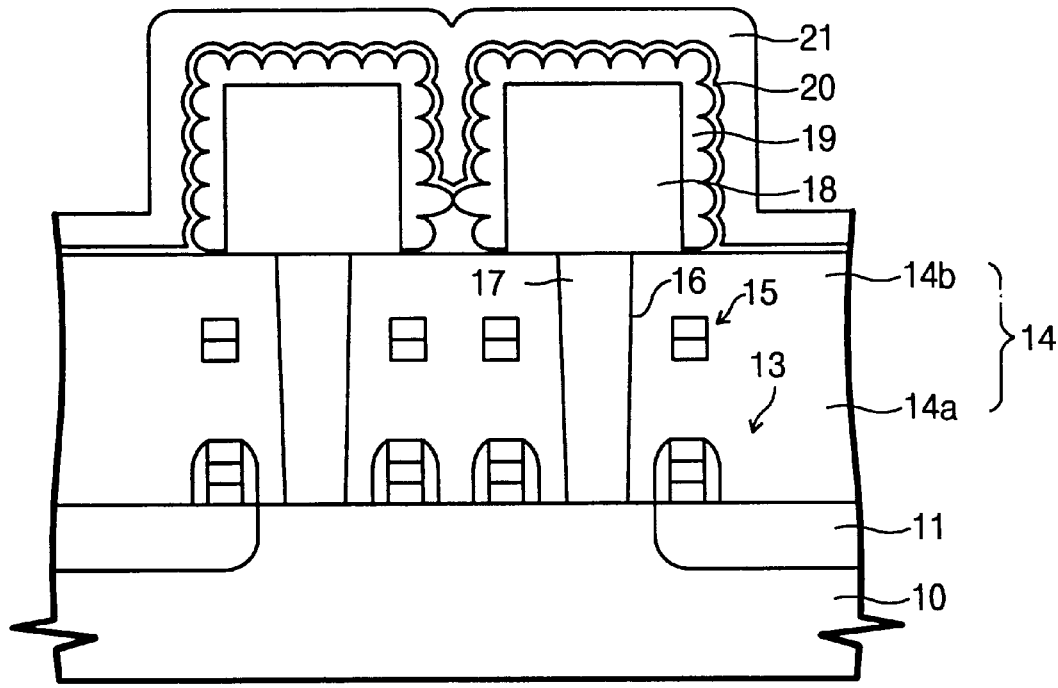
Figure 2A:
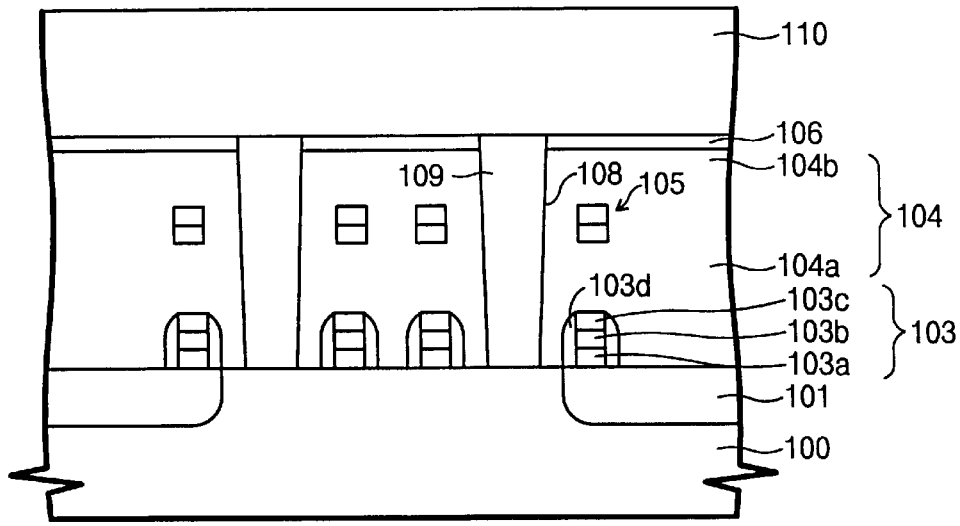
FIG. 2A to FIG. 2D are flow diagrams showing the process steps of a novel method of fabricating a capacitor for a semiconductor memory device.

Referring to FIG. 2A, a device isolation layer 101 for defining an active region and an inactive region is formed on a semiconductor substrate 100. A gate electrode layer 103 is formed on a gate oxide layer over the semiconductor substrate 100. The gate electrode layer 103 is formed to enable an insulating layer such as a silicon nitride layer spacer 103d to surround both sidewalls of a gate electrode formed from a polysilicon layer 103a, a silicide layer 103b, and a silicon nitride layer 103c.

A first oxide layer 104 serving as an insulating layer is formed on the semiconductor substrate 100 including the gate electrode layer 103. A bit line 105 is formed in the first oxide layer 104. To be further concrete, an oxide layer 104a having a planar top surface is formed on the semiconductor substrate 100 including the gate electrode layer 103. After formation of the bit line 105 on the oxide layer 104a, an oxide layer 104b having a planar top surface is formed on the oxide layer 104a including the bit line 105.

Next, a silicon nitride layer 106 having an etch selectivity with respect to an oxide layer and serving, for example, as an insulating layer is formed on the first oxide layer 104. The silicon nitride layer 106 and first oxide layer 104 are sequentially etched to form a contact hole 108 by using a contact hole formation mask until a surface of the semiconductor substrate 100 is exposed. As an example, the contact hole 108 can be formed to have a diameter of about 1,000 Å. However, those skilled in the art will readily be able to vary contact size to suit their circumstance.

After filling the contact hole 108 with a conductive material such as polysilicon, planar-etching is performed by an etch back or CMP (chemical mechanical polishing) process, thereby forming a plug 109 which is electrically connected to the semiconductor substrate 100. A second oxide layer 110 serving as an insulating layer is formed on the silicon nitride layer 106 including the plug 109. The second oxide layer 110 has, for example, a thickness of about 10,000 Å.

Figure 2B:
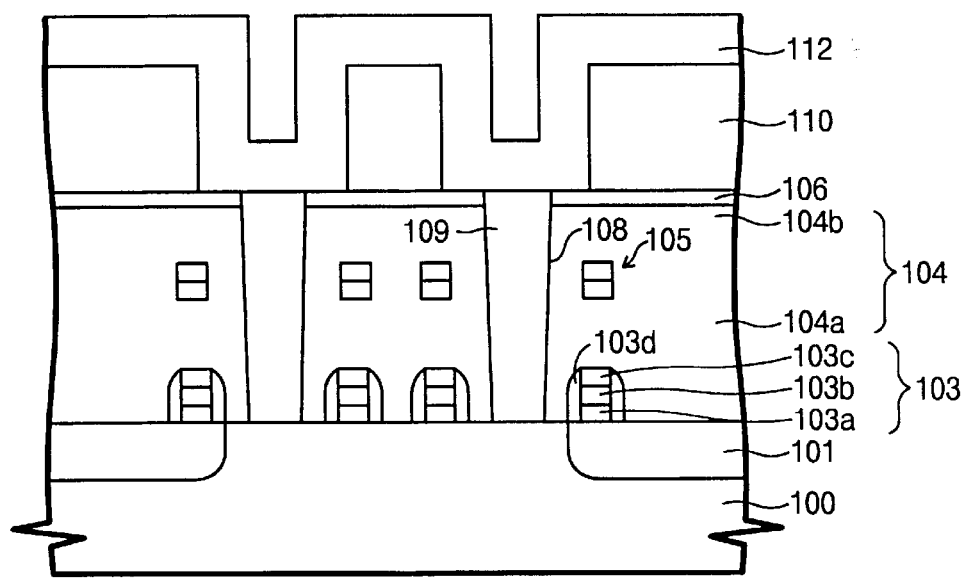

Referring to FIG. 2B, the second oxide layer 110 is etched by using a storage electrode formation mask until the plug 109 and a part of the etch stopper 106 are exposed, so that a storage electrode opening 111 is formed. The exposed etch stopper 106 in the opening 111 can be further removed until the first insulating layer 104 is exposed, so that the contact plug 109 protrudes from a top surface of the etch stopper 106. The opening 111, for example, can be formed to have a diameter of about 2,000 Å. A polysilicon layer 112 having a regular thickness is formed on a bottom and both sidewalls of the storage electrode opening 111 and the second oxide layer 110. The polysilicon layer 112 is doped and has, for example, a thickness of about 800 Å.

Figure 2C:
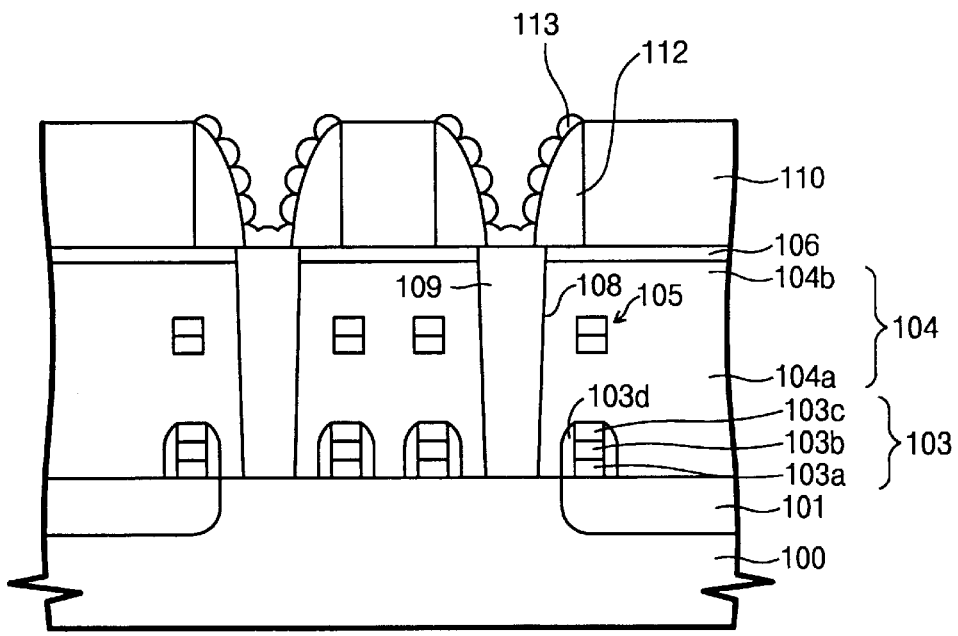
Figure 2D:
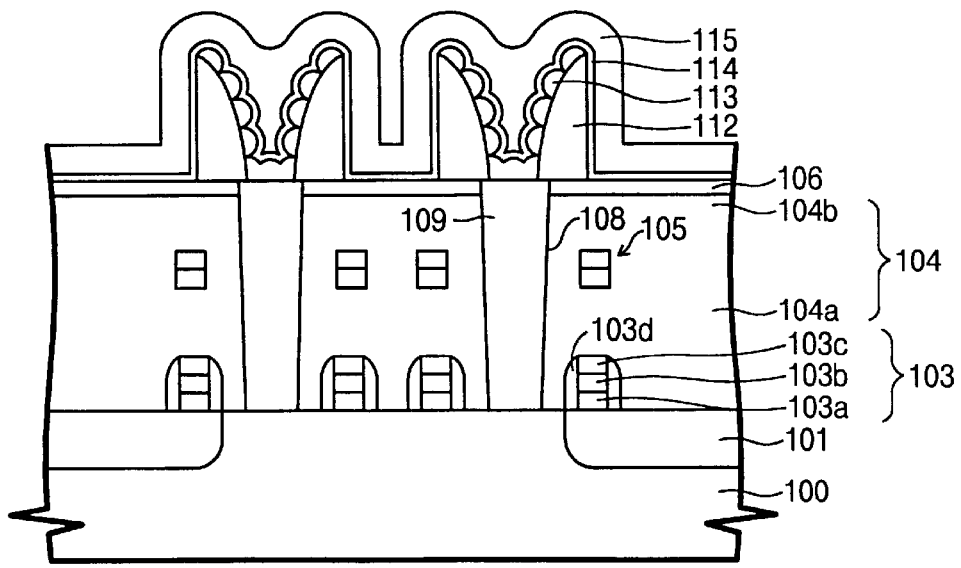

Referring to FIG. 2C, the polysilicon layer 112 is anisotropically etched, so that a conductive spacer 112 is formed on both sidewalls of the storage electrode opening 111. The conductive spacer 112 is formed to be electrically connected to the plug 109. More particularly, the conductive spacer 112 overlaps a portion of the plug 109. The second oxide layer 110 serves to support the conductive spacer 112 due to its etching selectivity thereto when the polysilicon layer 112 is anisotropically etched.

As can be seen in the drawing, the conductive spacer 112 is formed to overlap a portion of the contact plug 109. As described later, HSG silicon layer 113 is formed on the conductive spacer 112 and on the contact plug 109 and further electrically connecting the opposing sidewall conductive spacer 112 for better contact characteristics. Alternatively, the conductive spacer 112 can be formed on the sidewalls of the storage electrode opening 111 without overlapping the contact plug 109. For this alternative, a later-formed HSG silicon layer 113 can be formed on the conductive spacer 112 and on the contact plug 109 for electrical connection between the opposing spacer 112 and the contact plug 109.

Thereafter, an HSG (hemispherical grain) layer 113 is formed on the surfaces of the conductive spacer 112 and the plug 109. The HSG layer 113 is not grown on a surface of the insulating layer 110 but is grown selectively on a surface of the doped polysilicon layer 112 and the contact plug 109.

As mentioned above, the HSG layer 113 is grown after a storage electrode is made to be a spacer shape. Accordingly, each of the storage electrodes is insulated from an adjacent storage electrode by the second oxide layer 110, thereby preventing a micro-bridge. Furthermore, the surface area of a storage electrode is larger than that of a prior stack type capacitor, thereby increasing capacitance of a capacitor of a capacitor and reducing processing steps such as a photo process or etching process as compared to a cylinder type capacitor.

As mentioned above, the HSG layer 113 is grown after a storage electrode is made to be a spacer shape. Accordingly, each of the storage electrodes is insulated by from an adjacent storage electrode by the second oxide layer 110, thereby preventing a micro-bridge. Furthermore, a surface area of a storage electrode is larger than that of a prior stack type capacitor, thereby increasing capacitance of a capacitor of a capacitor and reducing processing steps such as a photo process or etching process as compared to a cylinder type capacitor.

A capacitor dielectric film 114 is then formed on the second oxide layer 110 including the HSG layer 113. The capacitor dielectric film 114 is made of, for example, one of the materials selected from a group including $Ta_2O_5$, $Si_3N_4$, NO, ONO, PZT. and BST. Finally, a doped polysilicon layer 115 is formed to serve as an upper capacitor electrode on the capacitor dielectric film 114, thereby forming a capacitor.

A capacitor dielectric film 114 is then formed on the first oxide layer 106 including the HSG layer 113. The capacitor dielectric film 114 is made of, for example, one of the materials selected from a group including $Ta_2O_5$, $Si_3N_4$, NO, ONO, PZT, and BST. Finally, a doped polysilicon layer 115 is formed to serve as an upper capacitor electrode on the capacitor dielectric film 114, thereby forming a capacitor.

A capacitor according to the present invention enables an HSG layer to grow on an internal wall of a storage electrode, thereby preventing a micro-bridge between storage electrodes resulting from abnormal growth or over-growth of the HSG layer.

Thus, a capacitor for a semicondutor memory device has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A capacitor for a semiconductor memory device, comprising:
   an insulating layer formed on a semiconductor substrate and having a contact hole exposing a surface of the semiconductor substrate;
   a plug made of a conductive material and electrically connected to the semiconductor substrate through the contact hole;
   a cylindrical storage node contacting a part of a top surface of the plug and exposing another part of the top surface of the plug, wherein the cylindrical storage node comprises at least inner and outer surfaces;
   an HSG (hemispherical grain) layer formed on the inner surface and the exposed part of the top surface of the plug to electrically connect the cylindrical storage node with the plug;
   a dielectric film in direct contact with the HSG (hemispherical grain) layer and the outer surface of the cylindrical storage node; and
   a plate node formed on the dielectric film.

2. The device according to claim 1, further comprising an etch stopper on the insulating layer outside of the storage node, wherein a top surface of the plug is the same level in height as a top surface of the etch stopper.

3. The device according to claim 2, wherein the etch stopper comprises silicon nitride and has a thickness of about 100 Å.

4. The device according to claim 1, wherein the insulating layer comprises an oxide.

5. The device according to claim 1, wherein the storage node comprises polysilicon.

6. The device according to claim 1, wherein the storage node has a height of about 10,000 Å.

7. The device according to claim 1, wherein the sidewalls of the cylindrical storage node have respectively a thickness of about 800 Å, the cylindrical storage node has a diameter of about 2,000 Å and the plug has a diameter of about 1,000 Å.

* * * * *